(12) United States Patent
Liu

(10) Patent No.: US 7,606,028 B2
(45) Date of Patent: Oct. 20, 2009

(54) HEAT DISSIPATION DEVICE HAVING A FAN HOLDER FOR ATTACHMENT OF A FAN

(75) Inventor: Jin-Biao Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 126 days.

(21) Appl. No.: 11/961,375

(22) Filed: Dec. 20, 2007

(65) Prior Publication Data

US 2009/0161314 A1  Jun. 25, 2009

(51) Int. Cl.
*H05K 7/20* (2006.01)
(52) U.S. Cl. .................. 361/697; 361/704; 361/710; 165/80.3; 165/185; 257/718; 257/722
(58) Field of Classification Search .................. None
See application file for complete search history.

(56) References Cited

U.S. PATENT DOCUMENTS

| | | | | |
|---|---|---|---|---|
| 5,677,829 A * | 10/1997 | Clemens | .................. | 361/697 |
| 6,311,766 B1 * | 11/2001 | Lin et al. | .................. | 165/80.3 |
| 6,341,644 B1 * | 1/2002 | Lo et al. | .................. | 165/80.3 |
| 6,392,885 B1 * | 5/2002 | Lee et al. | .................. | 361/697 |
| 6,520,250 B2 * | 2/2003 | Lee et al. | .................. | 165/121 |
| 7,089,999 B1 * | 8/2006 | Wu et al. | .................. | 165/80.3 |
| 7,131,485 B2 * | 11/2006 | Yu et al. | .................. | 165/80.3 |
| 7,289,330 B2 * | 10/2007 | Lu et al. | .................. | 361/710 |
| 2002/0139518 A1 * | 10/2002 | Lee et al. | .................. | 165/121 |
| 2007/0119567 A1 * | 5/2007 | Yeh et al. | .................. | 165/80.3 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipation device includes a heat sink, a fan and a fan holder locking the fan on the heat sink. The heat sink defines two slots in two opposite lateral sides thereof. The fan holder includes two opposite first beams and another two opposite second beams. Each of the first beams has a latching leg extending downwardly therefrom and two locking tabs extending upwardly therefrom. The two latching legs are engaged into the two slots of the heat sink. The locking tabs are fastened to two lateral sides of the fan.

16 Claims, 3 Drawing Sheets

HEAT DISSIPATION DEVICE HAVING A FAN HOLDER FOR ATTACHMENT OF A FAN

BACKGROUND OF THE INVENTION

1. Field of the Invention

The present invention relates generally to a heat dissipation device, and more particularly to a heat dissipation device incorporating a fan for dissipating heat generated by an electronic device, wherein, the heat dissipation device has a fan holder for attachment of the fan.

2. Description of Related Art

It is well known that during operation computer electronic devices such as central processing units (CPU) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is used to provide forced airflow to the heat sink. Usually, the fan is mounted to the heat sink directly or via a fan holder. Conventionally, the heat sink mainly comprises a heat-conducting base for contacting the heat generating electronic device and a plurality of heat dissipating fins extending from one face of the base. Typically, the fan is secured either on the heat sink or the fan holder by a plurality of screws. The fan defines a plurality of fixing holes corresponding to the screw threads of the heat sink or the fan holder. The pluralities of screws are engagingly received in the fixing holes of the fan and the screw threads of the heat sink or the fan holder, thereby attaching the fan to the heat sink. In this way, the fan can be mounted on the heat sink via a number of screws. However, complexities arise when installing the fan to the heat sink by using multiple screws which require a screwdriver to fix in place, as it may slip and damage nearby electronic components.

What is needed, therefore, is a heat dissipation device incorporating a fan holder to easily mount a fan on a heat sink.

SUMMARY OF THE INVENTION

A heat dissipation device includes a heat sink, a fan and a fan holder locking the fan on the heat sink. The heat sink defines two slots in two opposite lateral sides. The fan holder includes two opposite first beams and another two opposite second beams. Each of the first beams has a latching leg extending downwardly therefrom and two locking tabs extending upwardly therefrom. The two latching legs are engaged into the two slots of the heat sink. The locking tabs are fastened to two lateral sides of the fan. The fan is easily assembled to the heat sink via the fan holder, because either installation of the fan to the fan holder or the fan holder to the heat sink do not require any screws and relative tool, and can be simply completed by operations of proper placement and pushing via locking structure which is provided by the fan holder.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
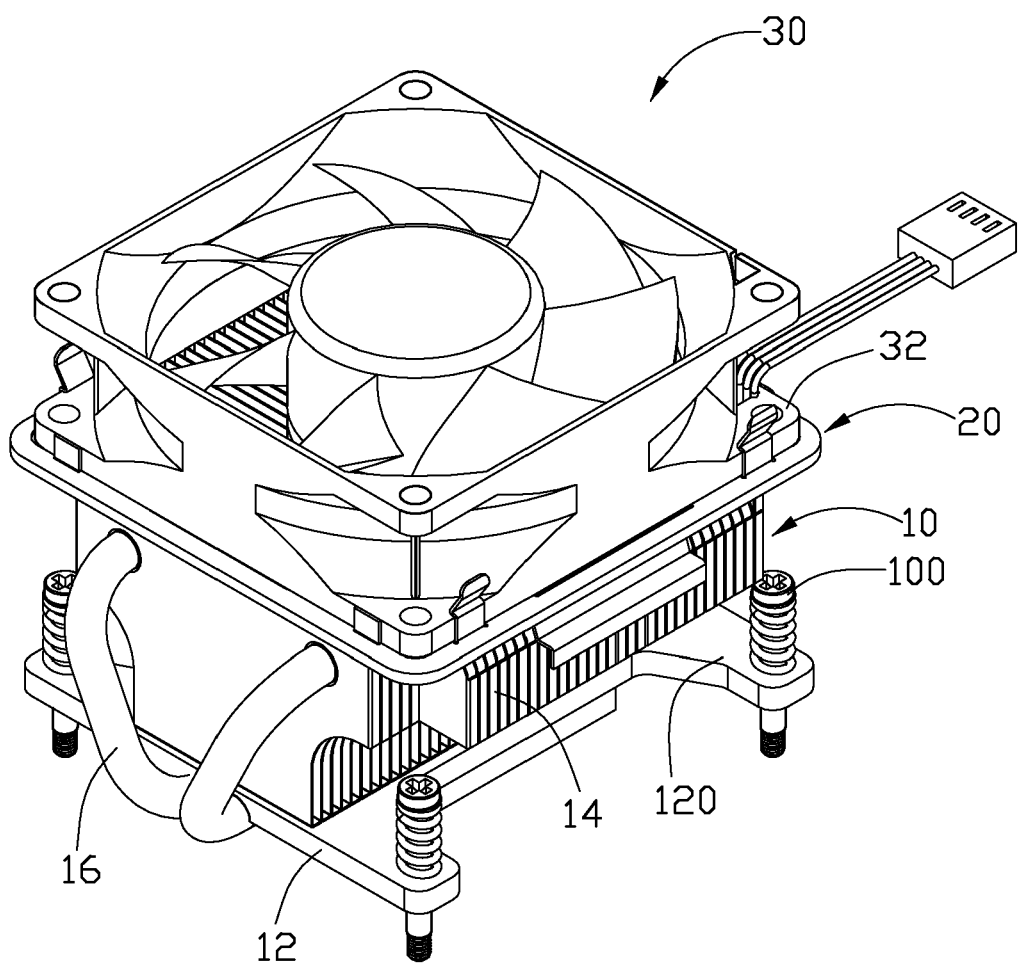
FIG. 1 is an assembled view of a heat dissipation device in accordance with a preferred embodiment of the present invention.
Figure 2:
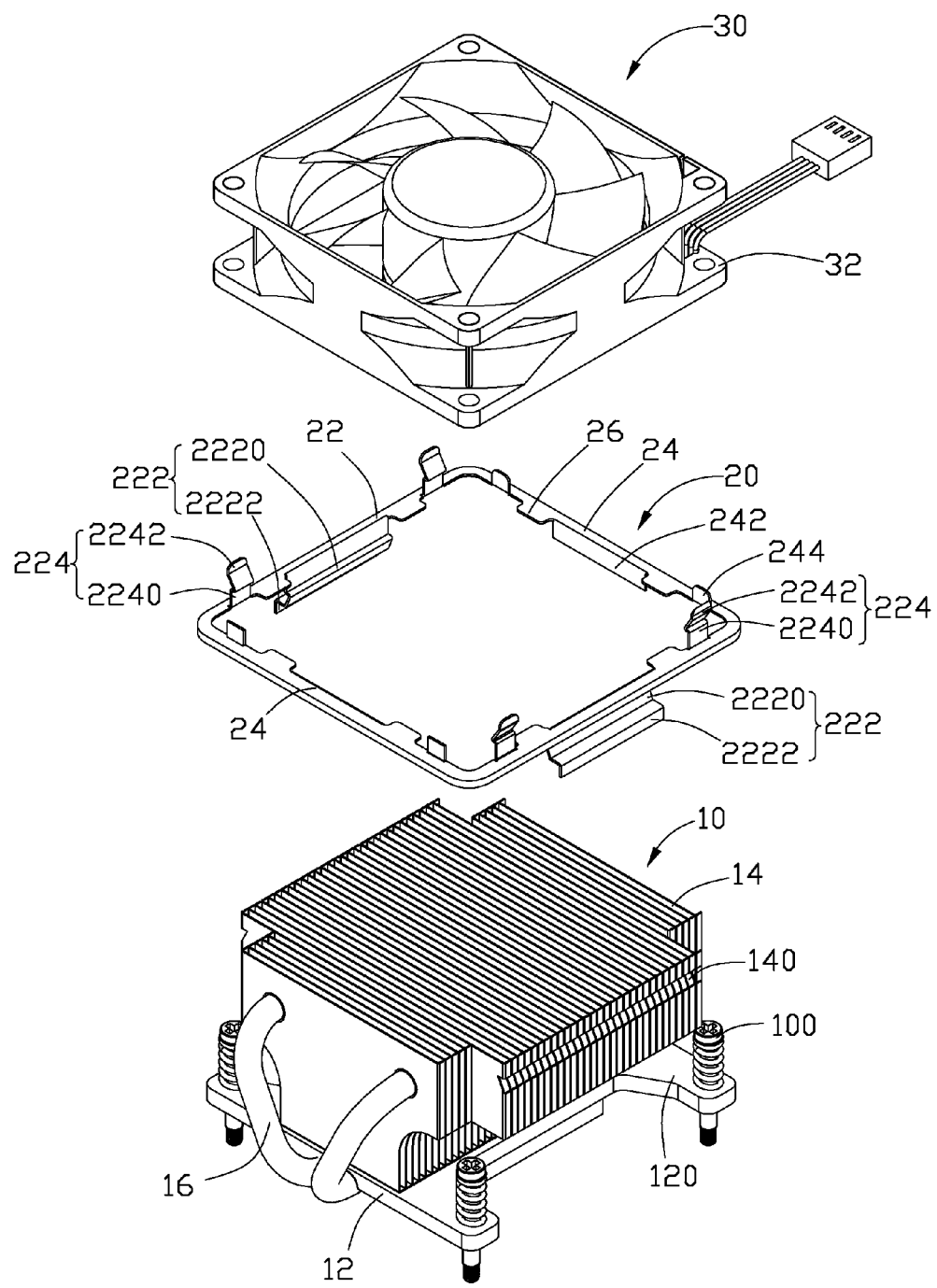
FIG. 2 is an exploded, isometric view of FIG. 1.
Figure 3:
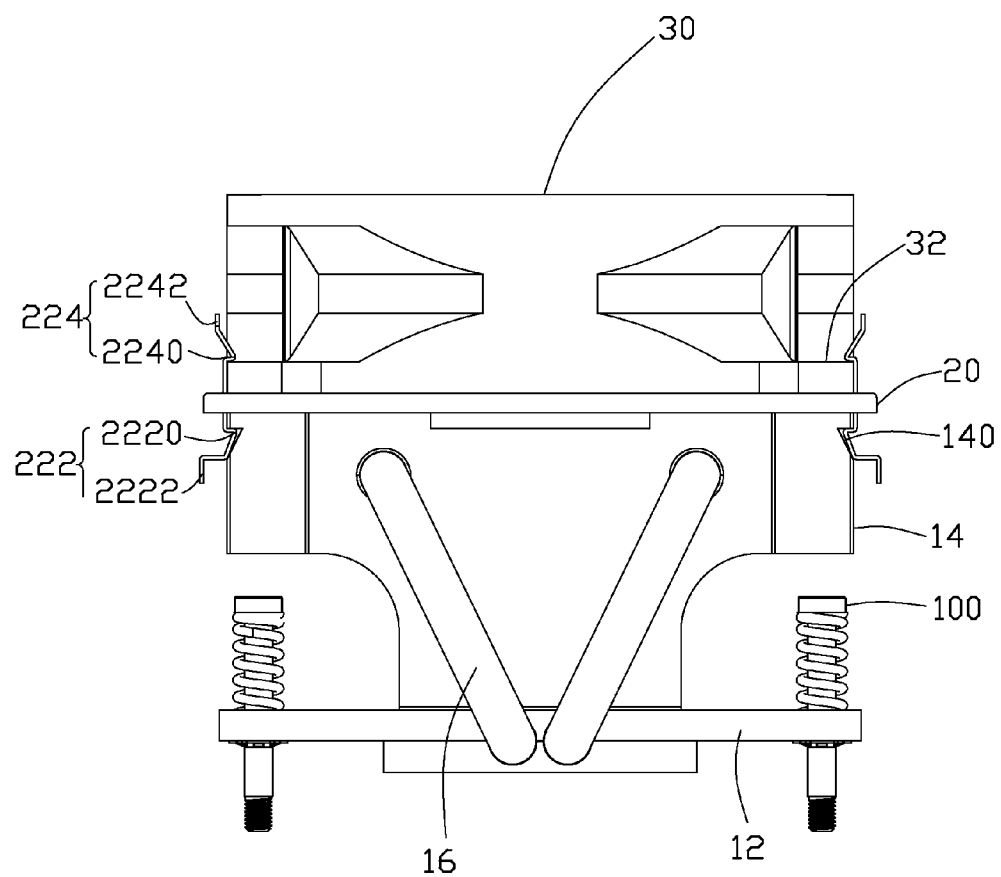
FIG. 3 is an elevation view of the heat dissipation device in FIG. 1.

FIGS. 1 to 3 illustrate a heat dissipation device in accordance with a preferred embodiment of the present invention. The heat dissipation device is adapted for removing heat from a heat-generated electronic component (not shown). The heat dissipation device comprises a heat sink 10, a fan holder 20 located on a top of the heat sink 10, and a fan 30 mounted on the heat sink 10 via the fan holder 20.

The heat sink 10 comprises a base 12, a plurality of fins 14 arranged on the base 12 and two heat pipes 16 connecting the base 12 and the fins 14 together. The base 12 is rectangular and has four fixing ears 120 extending laterally from four corners thereof. Each of the fixing ears 120 therein defines a fixing hole (not labeled) which receives a fixture 100 for securing the heat dissipation device onto the heat-generated electronic component. The fins 14 are spaced from each other and perpendicular to a top surface and two opposite lateral sides of the base 12. Top ends of the fins 14 are coplanar and cooperate to form a flat face for supporting the fan 30 thereon. Two elongated slots 140 for engaging with the fan holder 20 are defined in the two opposite ends of the fins 140. The slots 140 are located at the two lateral sides of the heat sink 10, parallel and adjacent to the top flat face of the fins 14. Each slot 140 has a flat surface (not labeled) and an inclined surface (not labeled) slantwise and downwardly extending from an inner edge of the flat surface in a manner such that depth of the slot 140 is decreasing gradually in a downward orientation.

The fan holder 20 is a rectangular frame and made of a resilient metal such as stainless or plated steel, and comprises two opposite first beams 22 and another two opposite second beams 24 respectively connecting to ends of the first beams 22. Each of the first beams 22 has a latching flake 222 extending downwardly from an inner edge thereof and two locking tabs 224 extending upwardly from the inner edge thereof. The latching leg 222 is located at a middle portion of the first beam 22 and has a length approximately equal to haft of a length of the first beam 22. The latching leg 222 comprises a first latching part 2220 having a configuration corresponding to that of the slot 140 for being engaged in the slot 140, and a first operating part 2222 connecting with the first latching port 2220 for facilitating an operation of the fan holder 20. Clearly shown in FIG. 3, the first latching part 2220 is bent inwardly and horizontally at a distal end of a vertical portion extending downwardly from the inner edge of the beam 22, then turns outwardly and obliquely to form a hook for engaging into the corresponding slot 140 of the heat sink 10. The first operating part 2222 further extends outwardly and horizontally from a distal end of the first latching part 2220, and is then bent downwardly and perpendicularly for facilitating to pull the corresponding latching part 2220 to disengage from the slot 140. The two locking tabs 224 are located at two opposite sides of the corresponding latching leg 222 and each comprise a second latching part 2240 and a second operating part 2242. The second latching part 2240 is bent inwardly and horizontally at a distal end of a vertical portion extending upwardly from the inner edge of the beam 22 to form a hook for being fastened to the fan 30. The vertical portion of the locking tab 224 are approximately equal to a thickness of a fixing flange 32 of the fan 30, so that the hook-shaped portion of the second latching part 2240 can fitly catch the lower fixing flange 32. The second operating part 2242 turns around and extends outwardly and obliquely from a distal end of the second latching part 2240, is then bent outwardly and vertically for facilitating to pull the corresponding second latching part 2240 to be disengaged from the fan 30.

Each of the second beams 24 has a restricting flake 242 extending downwardly from an inner edge thereof and two restricting tabs 244 extending upwardly from the inner edge thereof. The restricting flake 242 and the restricting tabs 244 are all perpendicular to the second beams 24, respectively abut against rear and front sides of the fan 30 to hold the fan 30 in predetermined position of the fan holder 20. The two restricting tabs 244 are located at two opposite sides of the restricting flake 242 and abut against rear and front sides of the fan 30 to hold the fan 30 in predetermined position of the fan holder 20. The restricting flakes 242 have a length approximately equal to haft of a length of the second beams 24 and abut against rear and front sides of the fins 14 to hold the fan holder 20 in position. The fan holder 20 has a plurality of supporting flakes 26 projecting inwardly from the inner edges thereof and located between the locking tabs 224 and the latching legs 222 or between the restricting tabs 244 and the restricting flakes 242 for supporting the fan 30 thereon.

The fan 30 has a rectangular frame (not labeled) having a size corresponding to that of the fan holder 20. The fixing flanges 32 are separately formed at each corner of the frame.

In assembly of the heat dissipation device, the fan holder 20 is placed on the top of the heat sink 10 and pressed downwardly to force the first latching parts 2220 of the latching legs 222 thereof to move through upper portion of the fins 14 and be engaged into the slots 140 of the heat sink 10. The restricting flakes 242 of the fan holder 20 are simultaneously moved to abut against the rear and front sides of the fins 14, whereby the fan holder 20 is quickly assembled to the heat sink 10. The fan 30 is then placed on the fan holder 20 and pressed downwardly to force the fan 30 to move downwardly and make the four second latching parts 2240 of the locking tabs 224 respectively catch the four lower fixing flanges 32 in four corners of the fan 30. The restricting tabs 244 of the fan holder 20 are simultaneously moved to abut against the two lateral sides of four lower fixing flanges 32 in the four corners of the fan 30, whereby the fan 30 is quickly assembled to the fan holder 20.

To release the locking of the fan 30 from the fan holder 20, a user only needs to move the second operating parts 2242 of the latching tabs 224 laterally to pull the second latching parts 2240 laterally until they are disengaged from the fixing flanges 32 of the fan 30, and then lifts the fan 30 from the fan holder 20. To release the fan holder 20 from the heat sink 10, a user only needs to pull the first latching parts 2222 laterally until they escape from the slots 140 of the heat sink 10, and then lifts the fan holder 20 upwardly from the heat sink 10.

It is understood, the user can choose others order in installation and uninstall of the heat dissipation device, such as the user can firstly assemble the fan 30 and the fan holder 20 together, and then fix the fan holder 20 with the fan 30 to the heat sink 10 to finish the installation.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat dissipation device comprising:
    a heat sink defining two slots in two opposite lateral sides thereof;
    a fan; and
    a fan holder comprising two opposite first beams and another two opposite second beams, each of the first beams having a latching leg extending downwardly therefrom and two locking tabs extending upwardly therefrom, the two latching legs engaged into the two slots of the heat sink, the locking tabs fastened to two lateral sides of the fan; and four restricting tabs respectively extend upwardly from the second beams and abut against front and rear sides of the fan, two restricting flakes extending downwardly from the second beam and abut against front and rear sides of the heat sink.

2. The heat dissipation device of claim 1, wherein restricting flakes and the restricting flakes are perpendicular to the second beams, the restricting flakes are located at two lateral sides of the restricting flakes.

3. The heat dissipation device of claim 1, wherein the slots are elongated, adjacent to and parallel to a flat face formed by top ends of the fins.

4. The heat dissipation device of claim 3, wherein depths of the slots are decreasing gradually in a downward orientation.

5. The heat dissipation device of claim 4, wherein each of the latching legs comprises a latching part which is engaged into the corresponding slot of the heat sink and an operating part at an lower end thereof.

6. The heat dissipation device of claim 5, wherein the latching part has a vertical portion extending downwardly from the inner edge of the beam and a hook-shaped portion at distal end thereof, the operating part further extends outwardly and horizontally from a distal end of the latching part and is then bent downwardly and perpendicularly.

7. The heat dissipation device of claim 5, wherein the latching leg is located at a middle portion of the first beam and has a length approximately equal to haft of a length of the first beam.

8. The heat dissipation device of claim 1, wherein the frame has two separated fixing flanges at each corner thereof, the locking tab has a latching part fastening to one of the lower fixing flanges of the fan and an operating part at upper end thereof.

9. The heat dissipation device of claim 8, wherein the second latching part has a vertical portion extending upwardly from the inner edge of the first beam and a hook extending inwardly from a distal end of the vertical portion, the operating part turns around and extends outwardly and obliquely from a distal end of the second latching part and is then bent outwardly and vertically.

10. The heat dissipation device of claim 9, wherein the vertical portion of the locking tab are approximately equal to a thickness of the fixing flange of the fan.

11. The heat dissipation device of claim 10, wherein the locking tabs are located at two opposite side of the corresponding latching legs and fasten to two lateral sides of the lower fixing flanges in four corner of the fan.

12. The heat dissipation device of claim 1, wherein the heat sink has base and a plurality of spaced fins vertically standing on the base, the two slots are defined in two opposite ends of the fins.

13. The heat dissipation device of claim 11, wherein the fins are perpendicular to the slots and have top ends that are coplanar and cooperate to form flat face.

14. A heat dissipation device, comprising:
- a heat sink comprising a base and a plurality of parallel fins extending vertically from the base, two opposite lateral sides of the fins each defining an elongated slot at an upper portion thereof;
- a fan mounted on a top of the heat sink; and
- a fan holder comprising a frame sandwiched between the top of the heat sink and a bottom of the fan, the frame comprising a pair of opposite first walls and a pair of opposite second walls connected to the first walls end to end to define an opening therein; each of the first walls forming an engaging tab engaged in the slot and a pair of latching tabs engaging with the fan, each of the second walls forming a pair of restricting tabs abutting against the fan, and a baffle tab is formed between the restricting tabs abutting against the fins at front and rear sides.

15. The heat dissipation device of claim 14, wherein an operating tab is formed at an end of the engaging tab for facilitating an operation of the fan holder.

16. The heat dissipation device of claim 14, wherein the slot has a flat surface and an inclined surface slantwise and downwardly extending from an inner edge of the flat surface, and the engaging tab of the fan holder has the same configuration as that of the slot.

* * * * *